(12) United States Patent
Powell

(10) Patent No.: US 6,265,297 B1
(45) Date of Patent: Jul. 24, 2001

(54) AMMONIA PASSIVATION OF METAL GATE ELECTRODES TO INHIBIT OXIDATION OF METAL

(75) Inventor: Don Carl Powell, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/388,133

(22) Filed: Sep. 1, 1999

(51) Int. Cl.$^7$ ................................................. H01L 21/318
(52) U.S. Cl. ........................ 438/592; 438/585; 438/197; 438/765
(58) Field of Search .................................. 438/592, 585, 438/765, 197

(56) References Cited

U.S. PATENT DOCUMENTS

| | | |
|---|---|---|
| 4,081,510 | 3/1978 | Kato et al. |
| 4,621,277 | 11/1986 | Ito et al. |
| 4,784,973 * | 11/1988 | Stevens et al. |
| 4,980,307 | 12/1990 | Ito et al. |
| 4,996,081 | 2/1991 | Ellul et al. |
| 5,003,375 | 3/1991 | Ichikawa |
| 5,057,449 | 10/1991 | Lowrey et al. |
| 5,094,712 | 3/1992 | Becker et al. |
| 5,100,826 | 3/1992 | Dennison |
| 5,132,756 * | 7/1992 | Matsuda |
| 5,177,027 | 1/1993 | Lowrey et al. |
| 5,236,865 | 8/1993 | Sandhu et al. |
| 5,266,510 | 11/1993 | Lee |
| 5,306,951 | 4/1994 | Lee et al. |
| 5,341,016 | 8/1994 | Prall et al. |
| 5,360,769 | 11/1994 | Thakur et al. |
| 5,376,593 | 12/1994 | Sandhu et al. |
| 5,393,683 | 2/1995 | Mathews et al. |
| 5,405,791 | 4/1995 | Ahmad et al. |
| 5,472,896 | 12/1995 | Chen et al. |
| 5,501,995 | 3/1996 | Shin et al. |
| 5,545,289 | 8/1996 | Chen et al. |
| 5,545,578 | 8/1996 | Park et al. |
| 5,550,084 | 8/1996 | Anjum et al. |
| 5,753,556 | 5/1998 | Katada et al. |

(List continued on next page.)

FOREIGN PATENT DOCUMENTS

| | | | |
|---|---|---|---|
| 0878443A1 | 11/1998 | (EP) | |
| 2134706 | 8/1984 | (GB) | 257/412 |
| 1-94664 | 4/1989 | (JP) | 257/412 |

OTHER PUBLICATIONS

Atkins, P.W., *Physical Chemistry*, p. 819 (1990).

Cherkashin et al., "Losses of Platinum–Metal Catalyst During Vapor–Oxygen Oxidation Of Ammonia", Brief Communications, Plenum Publishing Corporation, 1983, p. 628–630.

Ramis, et al., "Adsorption, Activation, and Oxidation of Ammonia over SCR Catalysts", Journal of Catalysis, vol. 157, 1995, p. 523–525.

Shebeko, et al., Investigation of Concentration Limits Of Flame Propagation In Ammonia–Based Gas Mixtures, Combustion, Explosion, and Shock Waves, vol. 33, No. 5, 1996 pp. 477–479

(List continued on next page.)

Primary Examiner—Charles Bowers
Assistant Examiner—Stephen W. Smoot
(74) Attorney, Agent, or Firm—Knobbe, Martens, Olson & Bear

(57) ABSTRACT

A method and apparatus is provided for wet oxidation while passivating metal elements by adsorption of a passivating species. A transistor gate stack includes a metallic layer that exhibits catalytic behavior in the presence of the passivating species. In particular, ammonia adsorbs upon the metallic layer. During wet oxidation, such as source/drain reoxidation, the adsorbed ammonia inhibits oxidation of the metal, preserving conductive material.

28 Claims, 5 Drawing Sheets

U.S. PATENT DOCUMENTS

| | | |
|---|---|---|
| 5,756,392 | 5/1998 | Lu et al. . |
| 5,897,349 | 4/1999 | Agnello . |
| 5,906,803 | 5/1999 | Leppalahti . |
| 5,914,091 | 6/1999 | Holst et al. . |
| 5,918,555 | 7/1999 | Winegar . |
| 6,150,257 * | 11/2000 | Yin et al. . |

OTHER PUBLICATIONS

Shimizu, et al. "Impact of Structure Proximity Gettering and Nitrided Oxide Side–Wall Spacer by Nitrogen Implantation on Sub–Quarter Micron CMOS LDD FETs", IEDM 95, pp. 859–862 (1995).

Ueshima, et al., "New Technology For Selective Catalytic Oxidation Of Ammonia To Nitrogen", Res. Chem. Intermed., vol. 24, 1988, p. 133–141.

van den Broek, et al., "Water–promoted ammonia oxidation by a platinum amine complex in zeolite HZSM–5 catalyst", Catalysis Letters vol. 55, 1998, pp. 79–82.

S. Wolf and R.N. Tauber, Silicon Processing for the VLSI Era, vol. 1—Process Technology, pp. 191–194, Lattice Press, Sunset Beach, CA (1986).

* cited by examiner

AMMONIA PASSIVATION OF METAL GATE ELECTRODES TO INHIBIT OXIDATION OF METAL

FIELD OF THE INVENTION

The present invention relates to generally to the protection of metal elements during oxidation of integrated circuit components, and more particularly to the passivation of metal layers in gate stacks during source/drain reoxidation.

BACKGROUND OF THE INVENTION

A general metal-oxide-semiconductor field-effect transistor (MOSFET) comprises a conductive electrode material formed over a gate dielectric (e.g., silicon oxide), which in turn overlies a semiconductor substrate (e.g., single-crystal semiconductor substrate). The electrode typically includes doped polysilicon, which entails many advantages as a gate electrode, and the underlying gate dielectric of today's commercial integrated circuits is typically a silicon dioxide layer grown out of the substrate.

The gate electrode material may also function as an interconnect. For example, dynamic random access memory (DRAM) word lines may be etched from a polysilicon layer deposited for the gates (often referred to in the industry as "poly-1"). Unfortunately, polysilicon resistivity is considerably higher than that of aluminum or other metals. Additionally, efforts to increase circuit density by scaling down device dimensions lead to polysilicon lines of decreasing width, leaving a small cross-sectional line area through which to conduct current. High polysilicon resistivity combined with small line width results in a high overall interconnect resistance, entailing greater power consumption, long propagation delays and slower access speeds. As integrated circuits are scaled down, access speed becomes a critical issue, so methods of reducing gate/interconnect resistivity are required.

In pursuit of lower overall gate resistance, highly conductive layers (e.g., metal, metal silicide, and/or metal nitride) have been implemented over the gate polysilicon, thus lowering the overall resistivity of the interconnect lines while retaining the gate integrity provided by polysilicon. For example, a layer of tungsten silicide or tungsten nitride may overlie the polysilicon, and another metal layer such as tungsten may overlie the silicide or nitride layer to further boost conductivity. Alternatively, a metal layer may also be deposited directly over the polysilicon, without the intervening metal silicide, depending upon stress and adhesion factors.

FIG. 1 illustrates a typical gate stack 10, comprising a metal layer 12 (e.g., tungsten), a metallic interlayer 14 (e.g., tungsten silicide), and a doped polysilicon layer 16, all overlying a gate oxide 18 which has been grown out of a silicon substrate 20. The interlayer 14 can comprise a metal silicide or metal nitride layer, or can be omitted altogether. An insulating cap layer (not shown) can also be formed at this stage.

After the layers that make up the gate stack 10 have been formed, gate structures are patterned in accordance with an integrated circuit design (e.g., a dynamic random access memory, or DRAM, array). FIG. 2 illustrates the result of patterning. After a resist mask 24 is formed by standard photolithographic processes, the stack 10 must then be etched through, thus producing a gate electrode 26 formed of the patterned polysilicon 28, silicide 30 and metal 32 straps, as shown. In general, plasma etches are utilized to create vertical profiles for the gate structures 26, although the particulars may vary depending upon the stack materials. The polysilicon layer 16 (FIG. 1), which is etched last of the stack materials, is usually etched by fluorine- or chlorine-based plasmas.

In either case, the plasma etch tends to cause considerable damage to the gate oxide 18 immediately subjacent the polysilicon layer 16 (FIG. 1). Such damage may result regardless of efforts to optimize etch selectivity and optical end point measurement techniques. FIG. 3 illustrates a closer view of the gate electrode 26 and physical damage (thinning) resulting from gate oxide 18 exposure to the plasma etch. It should be understood that damage to the chemical integrity of the gate oxide 18 also takes place as a result of photon-assisted and other damage during the ion bombardment generally utilized for anisotropic etching. The etch damage may also extend to the underlying silicon substrate.

A high quality gate insulator is required for reliable operation of the MOSFET device and of the circuit employing the MOSFET. Susceptibility to hot carrier effects and consequent charge trapping, high defect densities, silicon-oxide interface states, pinholes and oxide thinning can all cause punchthrough or tunneling current leakage. In turn, junction leakage results in increased threshold voltage and unreliable circuit operation. Damage to the gate oxide 18 caused by plasma etching may induce many of these problems, particularly at or near corners 35 of the gate 26. Aside from the illustrated physical thinning, plasma etching tends to damage oxide bonds, creating charge trap sites. Such structural damage extends laterally under the gate corners 35 as well as over adjacent source/drain regions. This damage must be repaired to improve the quality and life expectancy of the gate oxide 18. One common manner of repair is by a source/drain reoxidation step, a high temperature step performed in an oxygen environment.

Referring to FIG. 4, this reoxidation can involve wet oxidation at temperatures above 900° C. for a relatively long period (e.g., up to 30 minutes). During this process, the oxide under the gate corners 35 is thickened and corners 35 of the polysilicon gate 28 are rounded. Small bird's beak structures 40 at the thickened corners reduce lateral electric field strength in active areas adjacent the gate 28, thereby reducing hot electron injection through the reoxidized gate oxide 38 during transistor operation.

Unfortunately, conditions during source/drain reoxidation also result in oxidation of exposed gate materials. Thus, for the illustrated example, a layer of tungsten oxide ($WO_x$) 42 readily forms around tungsten metal straps 32. Similarly, oxides 44 such as tungsten oxide ($WO_x$) and silicon dioxide ($SiO_2$) grow out of the metallic interlayer strap 30.

The longer the reoxidation process and the higher the temperature, the more metal, metal nitride and/or silicide are consumed. The oxides 42, 44 formed in consumption of the metal in straps 30, 32 are insulating and so unable to contribute to word line conductivity. Thus, overall resistance can be radically increased by the source/drain reoxidation. Some metals, such as tungsten, are so readily oxidized that overall resistance is increased beyond tolerable levels, rendering such metals impractical for use in gate materials.

Accordingly, a need exists for gate fabrication processes and structures which permit low overall resistance at the gate level while maintaining high quality gate oxide composition.

SUMMARY OF THE INVENTION

In accordance with one aspect of the invention, a method is provided for protecting a metallic element on a semiconductor substrate from corrosion during an oxidation step. The method includes adsorbing a passivating species upon the metallic element to form a passivated metallic element. The passivated metallic element and a second element are exposed to an oxidant species. The second element is oxidized while heating the substrate.

In the illustrated embodiment, the passivating species is ammonia, which readily adsorbs upon metallic surfaces, such as a tungsten strap in a gate electrode stack. The oxidant is water vapor, and serves to reoxidize a gate dielectric at the corner of the gate and overlying source/drain regions of the substrate. After reoxidation, the ammonia can be readily desorbed and the integrated circuit completed by suitable further processing.

BRIEF DESCRIPTION OF THE DRAWINGS

These and other aspects of the invention will be readily apparent from the description below and the accompanying drawings, which are meant to illustrate and not to limit the invention, and wherein.

DETAILED DESCRIPTION OF THE PREFERRED EMBODIMENTS

The illustrated embodiments provide a method of minimizing oxidation of conductors in integrated circuits. Although the preferred embodiments are illustrated in the context of dynamic random access memory (DRAM) transistor gate electrodes and word lines, the skilled artisan will readily appreciate that the methods described herein will also have application to protecting electrodes of conduction lines susceptible to oxidation or other corrosion in other contexts.

As discussed in the "Background" section above, gate electrodes often comprise conductively doped polysilicon strapped with one or more highly conductive layers to lower total interconnect resistance. The conductive straps generally contain metal, such as metal, metal silicide, or metal nitride layers in various combinations. These layers preferably comprise refractory metals, such as tantalum (Ta), titanium (Ti) and tungsten (W). Other examples include molybdenum (Mo), cobalt (Co), magnesium (Mg), nickel (Ni) and copper (Cu).

The gate stack may therefore comprise a metal/poly stack, a metal/silicide/poly stack, silicide/poly, metal/nitride/poly, nitride/poly, or silicide/nitride/poly, among other possible combinations. In multiple layer gate stacks, metal nitride or silicide interlayers are sandwiched between metal and polysilicon layers to improve adhesion among the layers and reduce stress within the composite gate stack. Note that the gate stack may include more than one type of metal, such as a W/TiN/poly stack.

Preferably, conductive layers are chosen to minimize stress and maximize inter-layer adhesion. Most preferably, in accordance with the preferred embodiment, the layers contain metals or metal oxides to which a passivating species readily adsorb.

Figure 1:
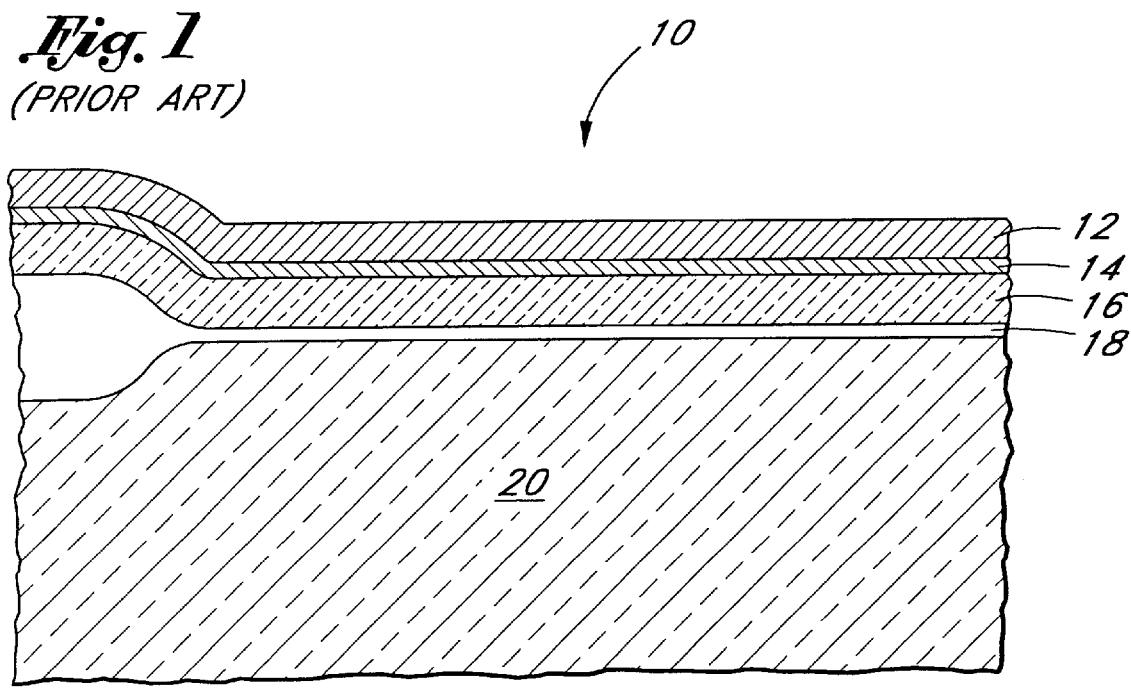
FIGS. 1–4 are partial, cross-sectional representations of a partially fabricated integrated circuit, generally illustrating a method of gate patterning and source/drain reoxidation in accordance with the prior art.
Figure 2:
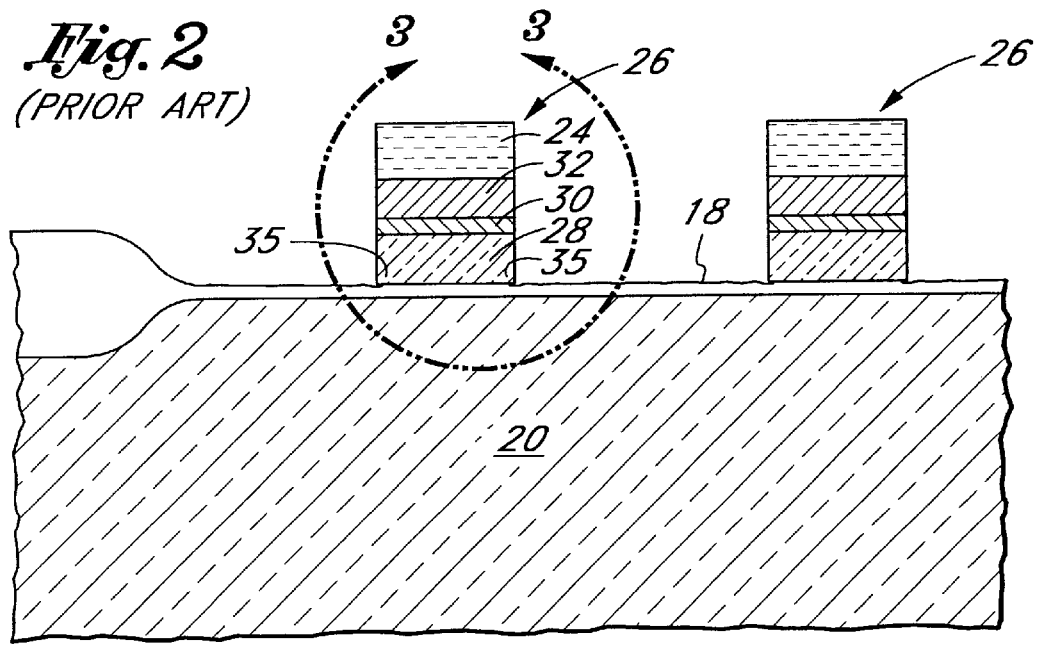
Figure 3:
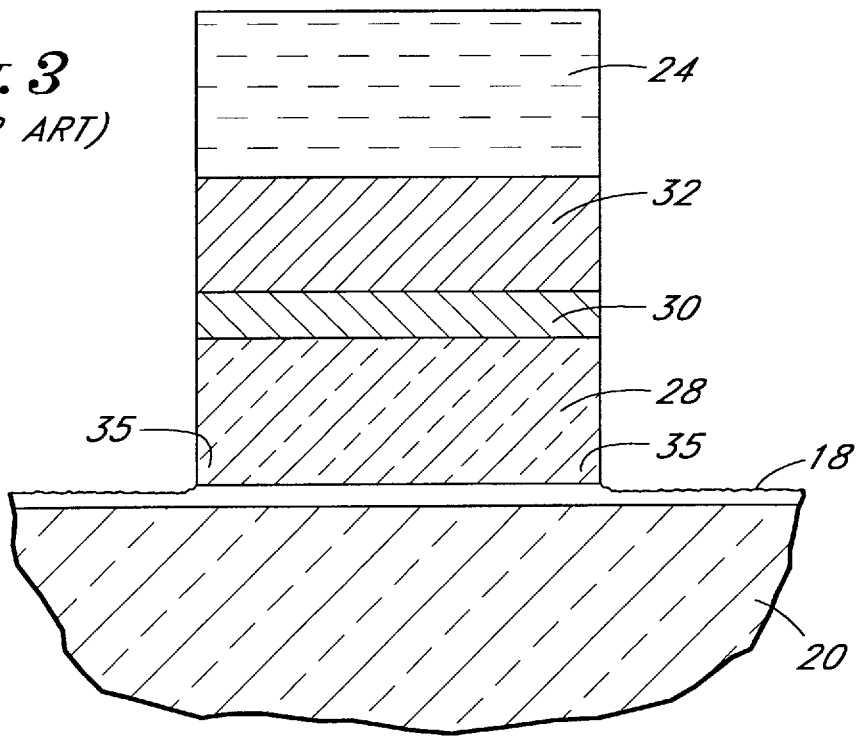
Figure 4:
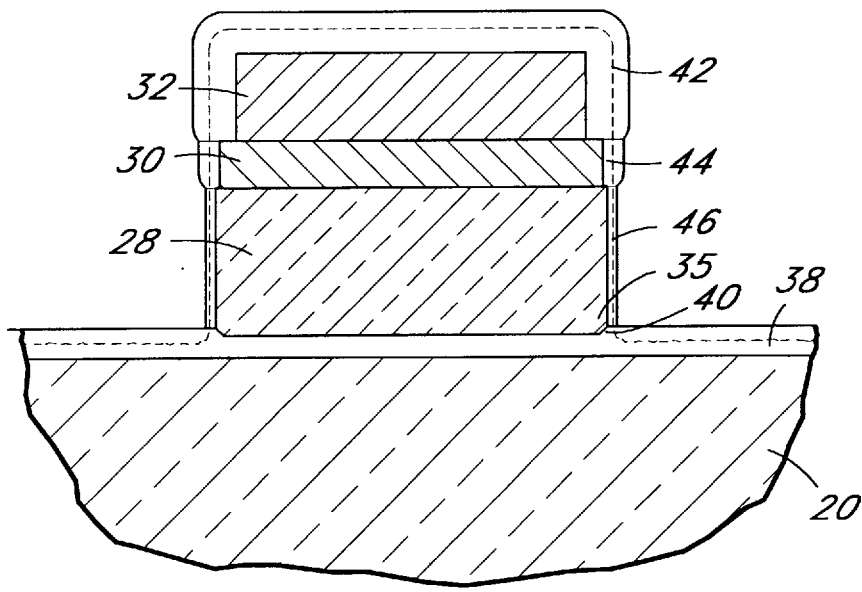
Figure 5:
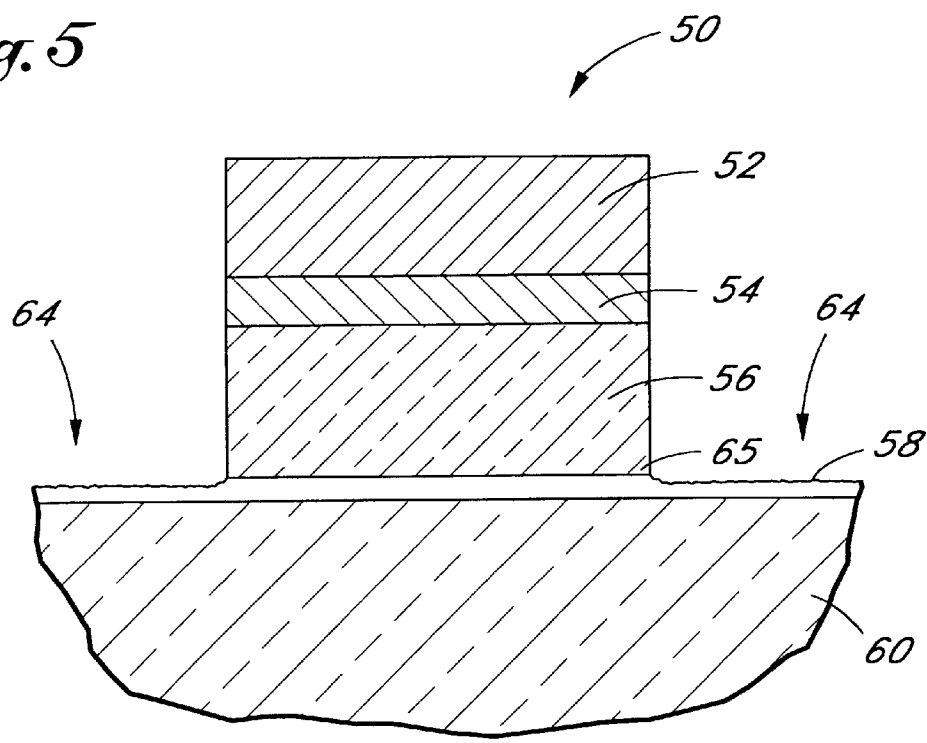
FIGS. 5–7 are partial, cross-sectional representations of a partially fabricated integrated circuit, generally illustrating the method of a preferred embodiment of the present invention.

FIG. 5 illustrates a patterned gate electrode stack 50 in accordance with preferred embodiment of the present invention. Although the present invention may be implemented in conjunction with gate electrodes including any of a number of metal-containing straps in various sequences, as discussed above, the gate stack 50 of the preferred embodiment includes a metal layer 52, a metallic interlayer 54 and a polysilicon layer 56. Note that the metal of the metal layer 52 and metallic interlayer 54 need not be the same. In the illustrated embodiment, the metal layer 52 comprises tungsten, which advantageously provides very high conductivity for high-speed word line transmission. The interlayer 54 preferably comprises a metal nitride and in the illustrated embodiment comprises TiN. The nitride is preferably formed by chemical vapor deposition (CVD). A post-deposition plasma treatment or anneal converts the nitride to a lower resistance phase, as is known in the art. Alternatively, the metal nitride of the gate stack 50 may be replaced with a metal silicide layer or other conductive adhesion or stress buffer layer.

As with prior art gates, the preferred gate stack 50 is formed over a gate dielectric 58, which in turn overlies a semiconductor substrate 60. In accordance with contemporary integrated circuit design, the substrate 60 comprises a silicon wafer and the gate dielectric 58 is a silicon oxide layer grown therefrom. It will be understood by one of skill in the art of semiconductor processing, however, that the "substrate" in alternative embodiments may comprise other forms of semiconductor layers which include active or operable portions of semiconductor devices. Moreover, the gate dielectric can, in other arrangements, comprise other materials, such as silicon nitride, $Ta_2O_5$, etc.

Once active areas have been isolated by growth of field oxide, the preferred gate oxide 58 is theremally grown and the conductive layers that make up the gate stack 50 are deposited. Though an insulating cap layer may also be formed at this stage, to be etched along with the conductive layers, the gate stack 50 is illustrated without an insulating cap at this stage, for simplicity of discussion. In accordance with the preferred embodiments, the gate oxide 58 should have a thickness of less than about 200 Å, more preferably less than about 150 Å, and is the illustrated embodiment is about 50 Å. The polysilicon layer 56 is preferably between 500 Å and 2,000 Å thick, nost preferably about 800 Å. The thickness of the metallic interlayer 54 is preferably between about 100 Å and 300 Å, most preferably about 200 Å, while the preferred metal layer 52 is preferably between about 200 Å and 1,000 Å, most preferably about 500 Å. The skilled artisan will readily appreciate that these dimensions will generally be scaled down for future generation devices.

After the layers have been formed over the silicon substrate 60, the layers are masked (using known photolithographic techniques) and etched through to expose the gate oxide over transistor source and drain regios 64. These regions are completed by later doping of the substrate 60 to either side of the gate 56. Since gate lengthrepresents the critical channel length of the integrated transistor, the gate stack 50 should be etched anisotropically to produce vertical sidewalls, thus faithfully reproducing the dimension on the photoresist mask. The particular etches used will vary with different metals, silicides, or nitrides. U.S. Pat. No. 5,094, 712, issued to Becker et al. and assigned to the assignee of the present invention, for example, discloses a one chamber, in-situ etch process for etching through an insulating cap oxide/silicide/poly stack. The disclosure of this patent is hereby incorporated by reference. Regardless of the overlying materials, etching through the polysilicon layer 56 generally produces some damage to the underlying gate oxide 58.

In accordance with current processing technology, the polysilicon layer 56 of the present invention is etched by a fluorine and chlorine plasma etch. Although chlorine plasma may provide better selectivity to the underlying gate oxide 58, as disclosed in U.S. Pat. No. 5,094,712, chlorine etches silicon more slowly than fluorine plasma. Accordingly, a preferred polysilicon etch comprises a $HBr:Cl_2$ volumetric ratio of between about 4:1 and 1:1, with a reactor RF power of 500 W. Reactor temperature should be maintained between about −10° C. and 100° C., with pressures between about 50 mTorr and 500 mTorr. The resist mask is then stripped, leaving the structure shown in FIG. 5.

Regardless of the particular etch, exposure to plasma etch in general causes damage to the gate oxide 58 in the source/drain regions 64, particularly near gate corners 65, including gate oxide thinning and damage to oxide bonds. As mentioned in the "Background" section above, this damage can be repaired by a high-temperature source/drain reoxidation, after the etch defines the gate stack. The process may take place in a typical oxidation chamber such as a batch furnace or a single-wafer rapid thermal processor. An oxidizing species is used to repair the source/drain (S/D) regions 64 in the presence of a passivating species, which is used to protect the metal-containing layers 52 and 54 from unwanted oxidation.

A commonly employed method for accomplishing source/drain oxidation in a metal gate transistor involves the use of water vapor ($H_2O$) and hydrogen gas ($H_2$) in a rapid thermal processor or batch furnace. The $H_2$ serves to reduce $WO_x$ to tungsten while water oxides silicon. The reactions are as follows:

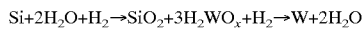

$$Si+2H_2O+H_2 \rightarrow SiO_2+3H_2WO_x+H_2 \rightarrow W+2H_2O$$

Unfortunately, the use of $H_2$ raises serious safety concerns. The explosive nature of the gas narrows the window of acceptable process conditions involving its use. Argon or other inert gas can be mixed with $H_2$ to mitigate some of the safety risks, but this dilution reduces the overall rate of reaction, which results in unsatisfactory processing times. In addition, $H_2$ can cause increased boron diffusion, rendering the $H_2$ reduction process less viable for use with surface p-channel devices in which implanted boron atoms are uniformly embedded within the silicon crystalline structure.

Figure 6:
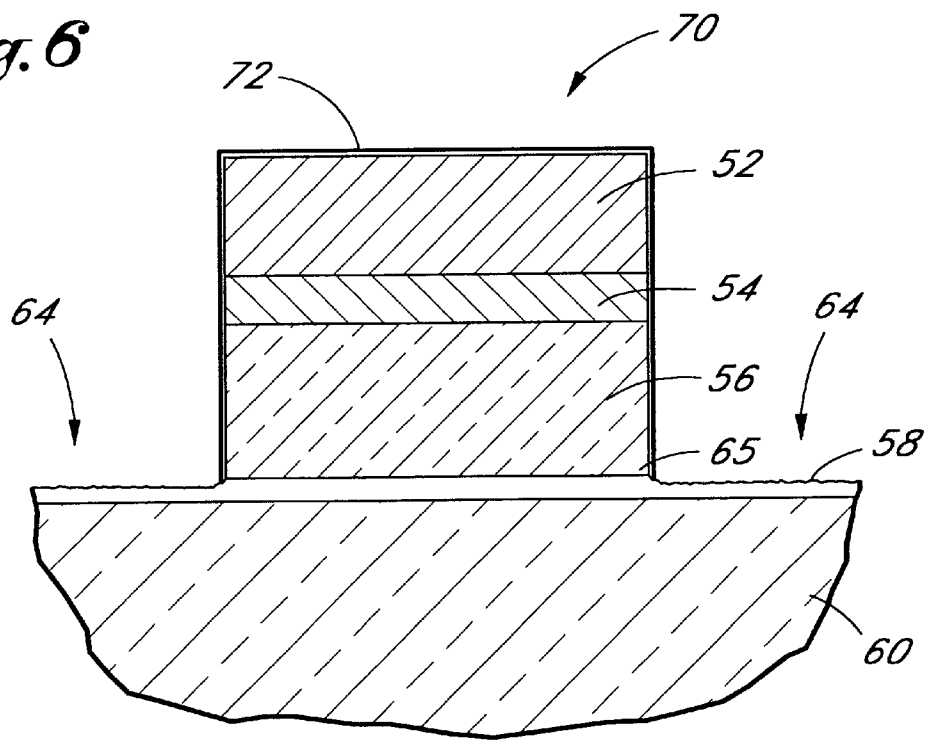

With reference to FIG. 6, a passivated gate stack 70 is shown with a passivation layer 72 formed thereupon. In accordance with the preferred embodiment, the source/drain (S/D) reoxidation is preceded by or accompanied by exposure of the gate stack 50 to a passivating species that readily adsorbs upon the metal in the gate stack 50. Advantageously, the gate stack 50 is exposed simultaneously in the illustrated embodiment to the passivating species and an oxidizing agent, preferably water vapor.

In the illustrated embodiment, the passivating species comprises ammonia ($NH_3$). The preferred metals and their oxides act as catalysts for certain reactions that include ammonia. In catalytic conversion processes, for example, ammonia adsorbs upon a metal-containing surface and is thereby primed for reaction with another species. For example, in the oxidation of waste ammonia, $NH_3$ adsorbs upon a metallic catalyst, $O_2$ reacts with the adsorbed $NH_3$ and water results from the reaction with lower activation energy than without the presence of the catalytic metal. See Ramis et al., "Adsorption, Activation and Oxidation of Ammonia over SCR Catalysts," JOURNAL OF CATALYSIS, Vol. 157, pp. 523–535 (1995).

The ready adsorption of ammonia upon metal or metal oxides of the gate stack surfaces advantageously protects the surfaces against reaction during the oxidation without consuming the metallic materials, particularly where the oxidant is water. It will be understood that other oxidants, such as $O_2$, may react with the adsorbed ammonia, such that water and $N_xO_y$ species are preferred oxidants for oxidation in conjunction with ammonia passivation.

In view of the present disclosure, the skilled artisan will readily appreciate that other passivating species may readily adsorb upon the exposed metal or metal oxides on the gate stack. The selected passivating species should be relatively non-reactive with the selected oxidant. Other suitable passivating species comprise NO (for passivation against oxidation by NO or $N_2O$); $C_xH_y$ (for passivation against oxidation by $O_2$, $O_3$, NO, $N_2O$, CO, $CO_2$); $CO_2$ (for passivation against oxidation by $H_2O$, NO, $N_2O$, CO); or CO (for passivation against oxidation by $N_2O$, $H_2O$, $O_2$,)

The volumetric ratio of $NH_3:H_2O$ is preferably between about 1:1 and 10:1, more preferably between about 2:1 and 7:1. $NH_3$ flow rates are preferably between about 1,000 sccm and 10,000 sccm, more preferably between about 2,000 sccm and 7,000 sccm. Water vapor is preferably flowed between about 50 sccm and 1,000 sccm, more preferably between about 500 sccm and 1,000 sccm. Pressures preferably range from approximately 250 mTorr to 50 atm., more preferably between about 350 Torr and 1,000 Torr, while the substrate temperature is maintained between about 400° C. and 1,150° C., more preferably between about 550° C. and 850° C.

As noted above, ammonia readily adsorbs upon metallic surfaces of the gate stack 50. During initial stages of this process, the ammonia passivates the metal-containing layers 52 and 54. While passivation is shown as a layer 72 over the passivated gate stack 70 in the drawings, it will be understood that the passivation by adsorption forms only one or two monolayers. Note that the Figures are schematic and not drawn to scale. The ammonia occupies reaction sites or pathways otherwise available for oxidation of the oxidation-susceptible metals.

Preferably, where ammonia flows simultaneously with water vapor, the passivation layer 72 is formed by initial formation of a monolayer of metal oxide over exposed surface of the metallic layers 52 and 54. In the illustrated embodiment, the metal layer 52 is a tungsten layer and a monolayer of tungsten oxide readily forms while the water vapor flows, or may already be present as a form of native oxide spontaneously formed on tungsten upon exposure to atmospheric conditions (i.e., air at room temperature). Excess metal (e.g., titanium) within the preferred interlayer 54 can also form an oxide upon exposure to the water vapor.

Ammonia then readily adsorbs onto the active sites of the catalytic metal oxide monolayer, thus forming the passivation layer 72. This layer 72 serves to inhibit further oxidation of metal within the gate stack 70, thereby preserving the integrity of their conductive nature. In other arrangements, where less readily oxidized metals are employed or where the metal surfaces are kept pristine prior to S/D reoxidation, ammonia can directly adsorb upon the metal surfaces.

The ammonia passivation can also very slightly nitridize the polysilicon 56. Nitridation of silicon, however, does not easily occur at temperatures less than 1,000° C. Accordingly, an extremely thin layer of $Si_3N_4$ can form as part of the passivation layer 72 over the exposed polysilicon, particularly where ammonia is introduced prior to the oxidant (water vapor). Preferably less than about 40 Å and more preferably less than about 20 Å of $Si_3N_4$ forms. Whatever $Si_3N_4$ does form may contribute to the passivation of the passivated gate stack 70, since $Si_3N_4$ serve as a barrier to oxygen diffusion. Nevertheless, the temperature ranges are preferably kept below the reaction threshold for nitridation of silicon, since this helps to avoid reaction in the source/drain regions 64 during the passivation step. Because most of the word line current is carried in the metal 52 and interlayer 54 of the passivated gate stack 70, passivation of the polysilicon 56 is not of primary concern.

Similarly, preferably less than about 20 Å of metal nitride or metal oxynitride forms over surfaces of the metal layer 52. Desirably, any such consumption is insignificant to conductivity of the word line.

Figure 7:
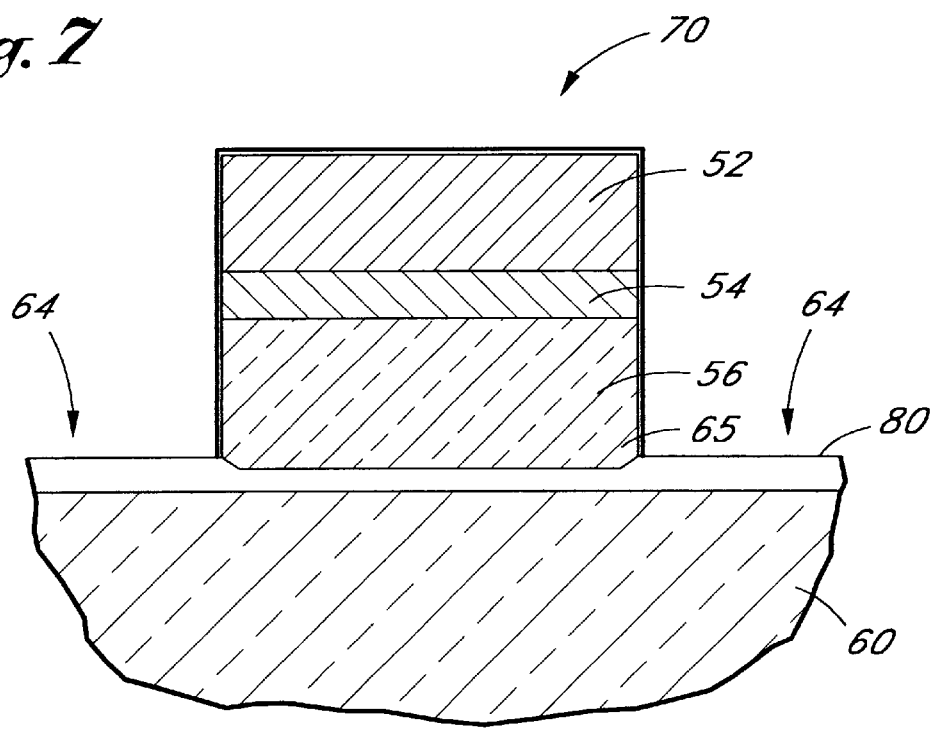

With reference to FIG. 7, continued flow of water vapor results in reoxidation of the source/drain regions 64, producing a high quality reoxidized gate oxide 80, having a preferred thickness between about 20 Å and 150 Å, most preferably about 80 Å, over the source/drain regions 64 of the silicon substrate 60. Depending on the temperature and pressure, processing times for sufficient reoxidation can be as short as about 20 seconds or as long as about 400 minutes. In an exemplary S/D reoxidation, ammonia flows at about 3,000 sccm, water vapor at about 300 sccm, with chamber pressure at about 760 Torr, substrate temperature about 650° C., and the processes is conducted for about 60 minutes.

The reoxidized gate oxide 80 demonstrates a low defect density for reliable transistor operation. A slight bird's beak structure 82 forms under each gate corner 65, rounding the corner 65 and reducing the operational lateral field strength. Thus, hot carrier injection into the gate oxide 80 is reduced, prolonging the useful life of the device.

Though illustrated in the context of thermal gate oxides, the skilled artisan will readily appreciate, in view of the present disclosure, that ammonia passivation will have application when oxidizing other materials in the presence of metal-containing elements. For example, materials having a high dielectric constant or permittivity ("high K" materials) often require oxidation anneals or reoxidation to maintain their integrity prior to sealing the integrated circuit. Such materials included tantalum oxide ($Ta_2O_5$), barium strontium titanate (BST), strontium titanate (ST), barium titanate (BT), lead zirconium titanate (PZT), and strontium bismuth tantalate (SBT). These materials are currently being incorporated into advanced DRAM capacitor structures and are envisioned in the role of gate dielectrics as critical dimensions continue to be scaled.

While not illustrated, some oxidation of the gate stack materials takes place during the S/D reoxidation, though less of the materials are consumed than would be in an unpassivated gate stack under the same conditions. Due to ammonia passivation, consumption of the width of the metal layer 52 is preferably less than about 150 Å, more preferably less than about 50 Å. In particular, using an exemplary process conducted at about 650° C. for about 180 minutes will consume less than about 60 Å of the metal layer 52.

The polysilicon layer 56 preferably loses between about 30 Å and 60 Å to nitridation and/or oxidation during the process. Accordingly, the width of the remaining polysilicon 56 is preferably greater than 40 Å more than the width of the remaining metal layer 52, more preferably between about 60 Å and 120 Å more than the width of the remaining metal layer 52, despite being defined by the same photoresist mask. The skilled artisan will appreciate in view of the present disclosure, however, that by controlling the ratio of $NO:N_2O$ by-products, the relative widths of the poly 56 and metal 52 layers can be controlled.

Figure 8:
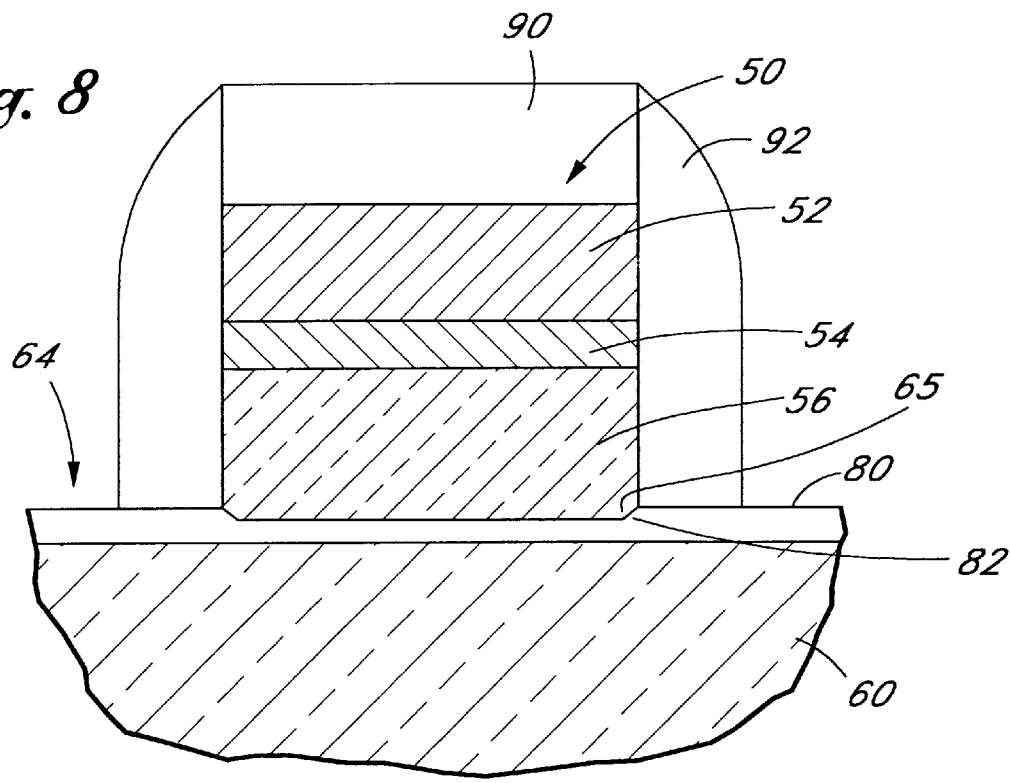
FIG. 8 is a partial, cross-sectional view of the partially fabricated integrated circuit of FIG. 7 following formation of protective spacers.

With reference now to FIG. 8, following SID reoxidation, ammonia and water vapor are purged from the reaction chamber, preferably with nitrogen and argon. The ammonia readily desorbs from the metallic layers 52 and 54, thereby leaving the unpassivated gate stack 50. Any nitridation and/or oxidation of the polysilicon 56, of course, remains after the purge/desorb step. Flow rates for $N_2$ are preferably between about 10,000 sccm and 30,000 sccm, more preferably about 15,000 sccm, while Ar preferably flows between about 10,000 sccm and 30,000 sccm, more preferably about 15,000 sccm. Depending upon the tool and handling equipment employed, the substrate can be cooled for handling or maintained at the oxidation temperature during purge and unload.

A cap layer 90 and sidewall spacers 92 are also shown in FIG. 8. As will be understood by the skilled artisan, the cap layer 90 is typically applied prior to patterning the gate stack. The sidewall spacers 92 are desirably formed after S/D reoxidation by blanket deposition and direction etch, such as reactive ion etch.

Figure 9:
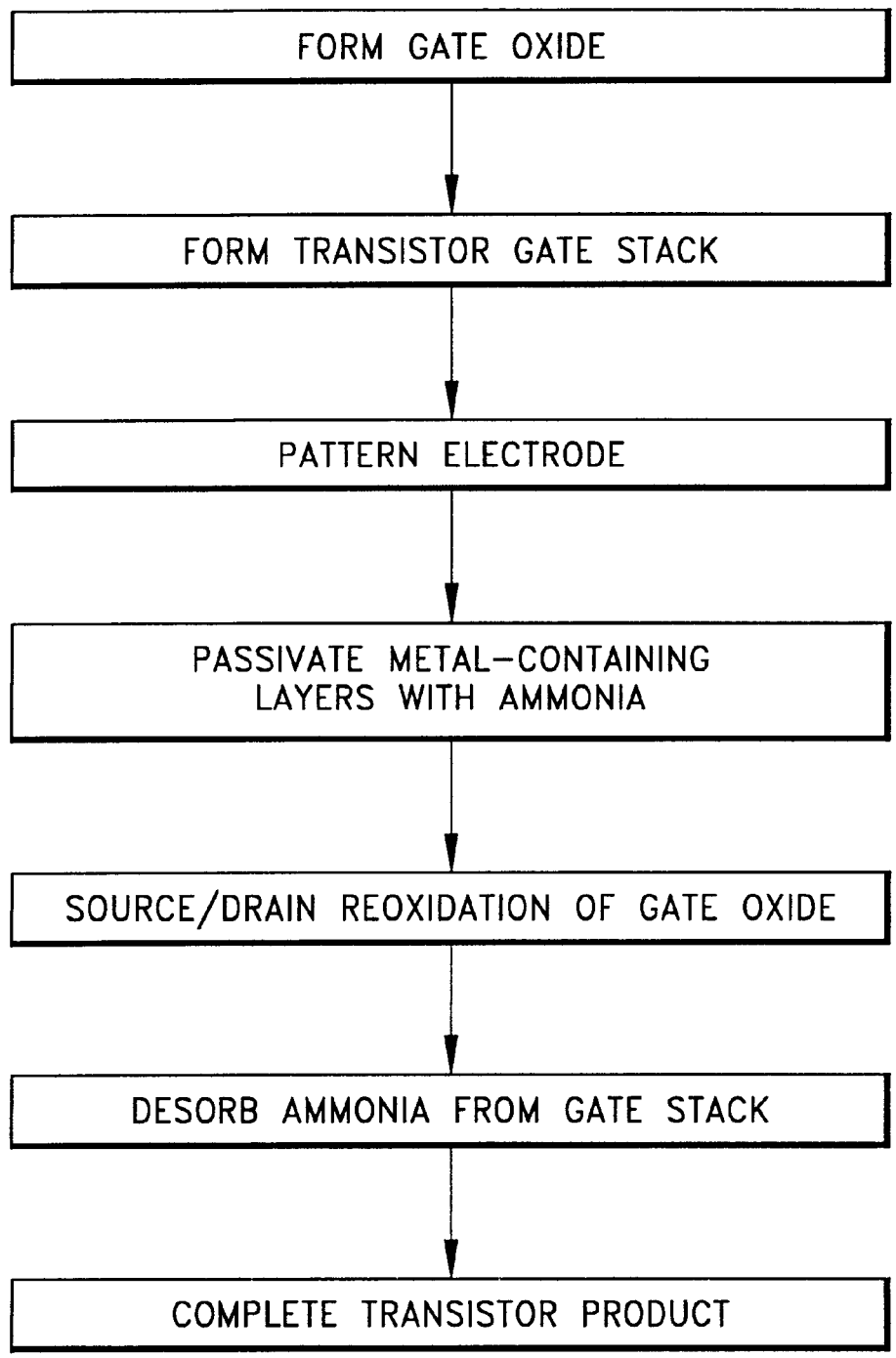
FIG. 9 is a flow chart generally illustrating processes in accordance with the present invention.

With reference now to FIG. 9, a flow chart generally illustrates the process described above, outlining a fabrication from definition of a transistor gate to source/drain reoxidation. These "steps" need not be completed in the illustrated order, nor are they necessarily segregated steps. In the preferred embodiment described above, for example, ammonia passivation is conducted simultaneously with initial stages of source/drain oxidation.

Other embodiments not discussed herein may become apparent to those skilled in art of semiconductor fabrication. In addition, those of ordinary skill in the art might find application for passivating metal features by ammonia adsorption at alternative stages of the integrated circuit fabrication process other than source/drain reoxidation. The invention may be incorporated into any step of the fabrication process in which selective oxidation of one element is desired while protecting another exposed element. Accordingly, the present invention is not to be limited by the description of preferred embodiments, but is instead to be defined solely by the appended claims.

I claim:

1. A process for passivating a metal element on a semiconductor substrate during an oxidizing anneal of a dielectric layer, comprising simultaneously exposing the metal element and the dielectric layer to ammonia and water vapor.

2. The process of claim 1, wherein the metal element comprises a layer in a transistor gate stack, and the dielectric layer comprises a gate dielectric.

3. The process of claim 1, wherein simultaneously exposing comprises forming a metal oxide over the metal element and adsorbing ammonia over the metal oxide.

4. The process of claim 1, wherein a volumetric ratio of ammonia to water while simultaneously exposing is between about 1:1 and 10:1.

5. The process of claim 1, wherein simultaneously exposing is performed at a temperature between about 400° C. and 1,150° C.

6. The process of claim 1, wherein simultaneously exposing at a temperature of about 650° C. for about 180 minutes consumes less than about 60 Å of the metal element.

7. The process of claim 1, wherein simultaneously exposing comprises adsorbing ammonia over the metal surfaces, thereby inhibiting oxide diffusion into the metal element.

8. The process of claim 7, further comprising desorbing the ammonia from over the metal element after annealing the dielectric layer in ammonia and water vapor.

9. A method of protecting a metallic element on a semiconductor substrate from corrosion during an oxidation step, the method comprising:

adsorbing a passivating species upon the metallic element to form a passivated metallic element;

exposing the passivated metallic element and a second element to an oxidant species;

oxidizing the second element while heating the substrate, wherein the metallic element is simultaneously exposed to the passivating species and the oxidant.

10. The method of claim 9, wherein the passivating species comprises ammonia.

11. The method of claim 9, wherein the passivating species is selected from the group consisting of NO, $CH_4$, $C_2H_2$, $C_2H_4$, $C_2H_6$, $C_3H_4$, $C_3H_6$, $C_3H_8$, $C_4H_2$, $C_4H_6$, $C_4H_8$, $C_4H_{10}$, $C_5H_4$, $C_5H_6$, $C_5H_8$, $C_5H_{10}$, $C_5H_{12}$, $C_6H_4$, $C_6H_6$, $C_6H_8$, $C_6H_{10}$, $C_6H_{12}$, $CO_2$ and CO.

12. The method of claim 9, wherein the second element comprises a dielectric layer.

13. The method of claim 12, wherein the dielectric layer comprises a silicon oxide layer.

14. The method of claim 13, wherein the silicon oxide layer comprises a gate dielectric over a source/drain region.

15. A method of source/drain reoxidation, the method comprising:

exposing a transistor gate electrode to a passivating species;

adsorbing the passivating species on surfaces of the gate electrode; and oxidizing adjacent source and drain regions while the passivating species remains adsorbed upon the surfaces of the transistor gate electrode, wherein the gate electrode is simultaneously exposed to the passivating species and an oxidant.

16. The method of claim 15, wherein water vapor is flowed at a rate between about 500 sccm and 1,000 sccm and ammonia is flowed at a rate between about 2,000 sccm and 7,000 sccm.

17. The method of claim 15, wherein the passivating species comprises ammonia and the oxidant comprises water vapor.

18. A method of source/drain reoxidation, the method comprising:

exposing a transistor gate electrode to a passivating species;

adsorbing the passivating species on surfaces of the gate electrode;

oxidizing adjacent source and drain regions while the passivating species remains adsorbed upon the surfaces of the transistor gate electrode; and desorbing the passivating species after oxidizing the adjacent source and drain regions.

19. The method of claim 18, wherein the passivating species comprises ammonia.

20. The method of claim 18 or claim 15, wherein oxidizing comprises exposing the adjacent source and drain regions to water vapor at a temperature between about 400° C. and 1150° C.

21. The method of claim 20, wherein oxidizing comprises exposing the adjacent source and drain regions to water vapor in a chamber at a pressure between about 350 Torr and 1000 Torr.

22. The method of claim 21, wherein oxidizing comprises exposing the adjacent source and drain regions to water vapor for a period between 5 seconds and 400 minutes.

23. A method of protecting a metallic element on a semiconductor substrate from corrosion during an oxidation step, the method comprising:

adsorbing a passivating species upon the metallic element to form a passivated metallic element;

exposing the passivated metallic element and a second element to an oxidant species;

oxidizing the second element while heating the substrate; and desorbing the passivating species after oxidizing the second element.

24. The method of claim 23, wherein the passivating species comprises ammonia.

25. The method of claim 23, wherein the passivating species is selected from the group consisting of NO, $CH_4$, $C_2H_2$, $C_2H_4$, $C_2H_6$, $C_3H_4$, $C_3H_6$, $C_3H_8$, $C_4H_2$, $C_4H_6$, $C_4H_8$, $C_4H_{10}$, $C_5H_4$, $C_5H_6$, $C_5H_8$, $C_5H_{10}$, $C_6H_{12}$, $C_6H_4$, $C_6H_6$, $C_6H_8$, $C_6H_{10}$, $C_6H_{12}$, $CO_2$ and CO.

26. The method of claim 23, wherein the second element comprises a dielectric layer.

27. The method of claim 26, wherein the dielectric layer comprises a silicon oxide layer.

28. The method of claim 27, wherein the silicon oxide layer comprises a gate dielectric over a source/drain region.

* * * * *